(12) United States Patent
Zampardi, Jr.

(10) Patent No.: US 9,054,065 B2
(45) Date of Patent: Jun. 9, 2015

(54) BIPOLAR TRANSISTOR HAVING COLLECTOR WITH GRADING

(75) Inventor: Peter J. Zampardi, Jr., Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/460,521

(22) Filed: Apr. 30, 2012

(65) Prior Publication Data

US 2013/0285120 A1 Oct. 31, 2013

(51) Int. Cl.
*H01L 29/02* (2006.01)
*H01L 29/36* (2006.01)
*H01L 29/737* (2006.01)
*H01L 29/08* (2006.01)
*H01L 29/20* (2006.01)

(52) U.S. Cl.
CPC ............ *H01L 29/36* (2013.01); *H01L 29/7371* (2013.01); *H01L 29/0821* (2013.01); *H01L 29/0826* (2013.01); *H01L 29/20* (2013.01)

(58) Field of Classification Search
CPC ............ H01L 29/7371; H01L 29/0821; H03F 1/3247
USPC .......................................... 257/197, 565–593
See application file for complete search history.

(56) References Cited

U.S. PATENT DOCUMENTS

| | | | |
|---|---|---|---|
| 6,233,440 B1 * | 5/2001 | Taylor ........................ | 455/127.2 |
| 6,906,359 B2 | 6/2005 | Zampardi et al. | |
| 7,038,250 B2 * | 5/2006 | Sugiyama et al. ............ | 257/183 |
| 7,687,886 B2 * | 3/2010 | Pan et al. ...................... | 257/565 |
| 7,791,132 B2 * | 9/2010 | Banerjee et al. .............. | 257/328 |
| 2003/0222278 A1 * | 12/2003 | Liu et al. ........................ | 257/197 |
| 2004/0188712 A1 * | 9/2004 | Lee et al. ....................... | 257/197 |

OTHER PUBLICATIONS

Yang, Y. et al., DC boosting effect of active bias circuits and its optimization for class-AB InGaP-GaAs HBT power amplifiers, IEEE Transactions on Microwave Theory and Techniques, 52, 1455-1463 (2004).*
Han, K. et al., A 900 MHz, 21 dBm CMOS linear power amplifier with 35% PAE for RFID readers, J. Semicond., 31, 125005 (2010).*
Kayali, et al., JPL Publication 96-25 GaAs MMIC Reliability Assurance Guideline for Space Applications, Dec. 15, 1996, National Aeronautics and Space Administration. 221 Pages.
Noort, et al., "Reduction of UHF Power Transistor Distortion With a Nonuniform Collector Doping Profile", IEEE Journal of Solid-State Circuits, pp. 1399-1406, vol. 36, No. 9, Sep. 2001.

(Continued)

*Primary Examiner* — Thao X Le
*Assistant Examiner* — Gardner W Swan
(74) *Attorney, Agent, or Firm* — Knobbe, Martens, Olson & Bear, LLP

(57) ABSTRACT

This disclosure relates to bipolar transistors, such as heterojunction bipolar transistors, having at least one grading in the collector. One aspect of this disclosure is a bipolar transistor that includes a collector having a high doping concentration at a junction with the base and at least one grading in which doping concentration increases away from the base. In some embodiments, the high doping concentration can be at least about $3\times10^{16}$ cm$^{-3}$. According to certain embodiments, the collector includes two gradings. Such bipolar transistors can be implemented, for example, in power amplifiers.

31 Claims, 7 Drawing Sheets

(56) References Cited

OTHER PUBLICATIONS

Spirito et al., "Experimental Procedure to Optimize Out-of-Band Terminations for Highly Linear and Power Efficient Bipolar Class-AB RF Amplifiers," IEEE BCTM 7.3. pp. 112-115, 2005.
Ishibashi, et al., "A Possible Near-Ballistic Collection in an AlGaAs/GaAs HBT with a Modified Collector Structure", IEEE Transactions on Electron Devices, pp. 401-404, vol. 35, No. 4, Apr. 1988.
Ishibashi, et al., "Ultra-High Speed AlGaAs/GaAs Heterojunction Bipolar Transistors", IEEE IEDM. 1988. 4 Pages.
Cismaru, et al., "High Volume Test Methodology for HBT Device Ruggedness Characterization", CS MANTECH Conference, May $17^{th}$-$20^{th}$, 2010, Portland, Oregon, USA. 4 Pages.
Lee, et al., "The Safe Operating Area of GaAs-Based Heterojunction Bipolar Transistors", IEEE Transactions on Electron Devices, pp. 2681-2688. vol. 53, No. 11, Nov. 2006.
Zanoni et al., "Measurements and Simulation of Avalanche Breakdown in Advanced Si Bipolar Transistors", IEEE IEDM 92-927. 1992, pp. 36.4.1-36.4.4.
Iwai et al., "63.2% High Efficiency and High Linearity Two-stage InGaP/GaAs HBT Power Amplifier for Personal Digital Cellular Phone System", IEEE MTT-S Digest, pp. 435-438. 1998.
Malm et al., "Implanted collector profile optimization in a SiGe HBT process", Solid State Electronics 45 (2001) pp. 399-404.
Humphreys et al., "Control of avalanche injection in bipolar transistors through the use of graded collector impurity profiles", IEE Proceedings, vol. 134, Pt. I. No. 5, Oct. 1987, pp. 141-147.
Liu et al., "A Proposed Collector Design of Double Heterojunction Bipolar Transistors for Power Applications", IEEE Electron Device Letters, pp. 309-311, vol. 16, No. 7, Jul. 1995.
Ohara, S., et al., "InGaP/GaAs Power HBTs with a Low Bias Voltage," International Electronic Devices Meeting (IEDM), pp. 791-94, 1995.
Hartmann, Q.J., et al., "Effect of Collector Design on the d.c. Characteristics of $In_{0.49}GA_{0.51}P$/GaAs Heterojunction Bipolar Transistors," Solid State Electronics vol. 38, No. 12, pp. 2017-2021, 1995.
Tu, Min-Chang et al., Performance of High-Reliability and High-Linearity InGaP/GaAs HBT PAs for Wireless Communication, IEEE Transactions on Electron Devices, vol. 57, No. 1, pp. 188-194, Jan. 2010.
Wang, Che-Ming et al., "Improved InGaP/GaAs HBTs AC Performance and Linearity with Collector Design," Department of Electrical Engineering, National Central University, 4 pages, 2004.

\* cited by examiner

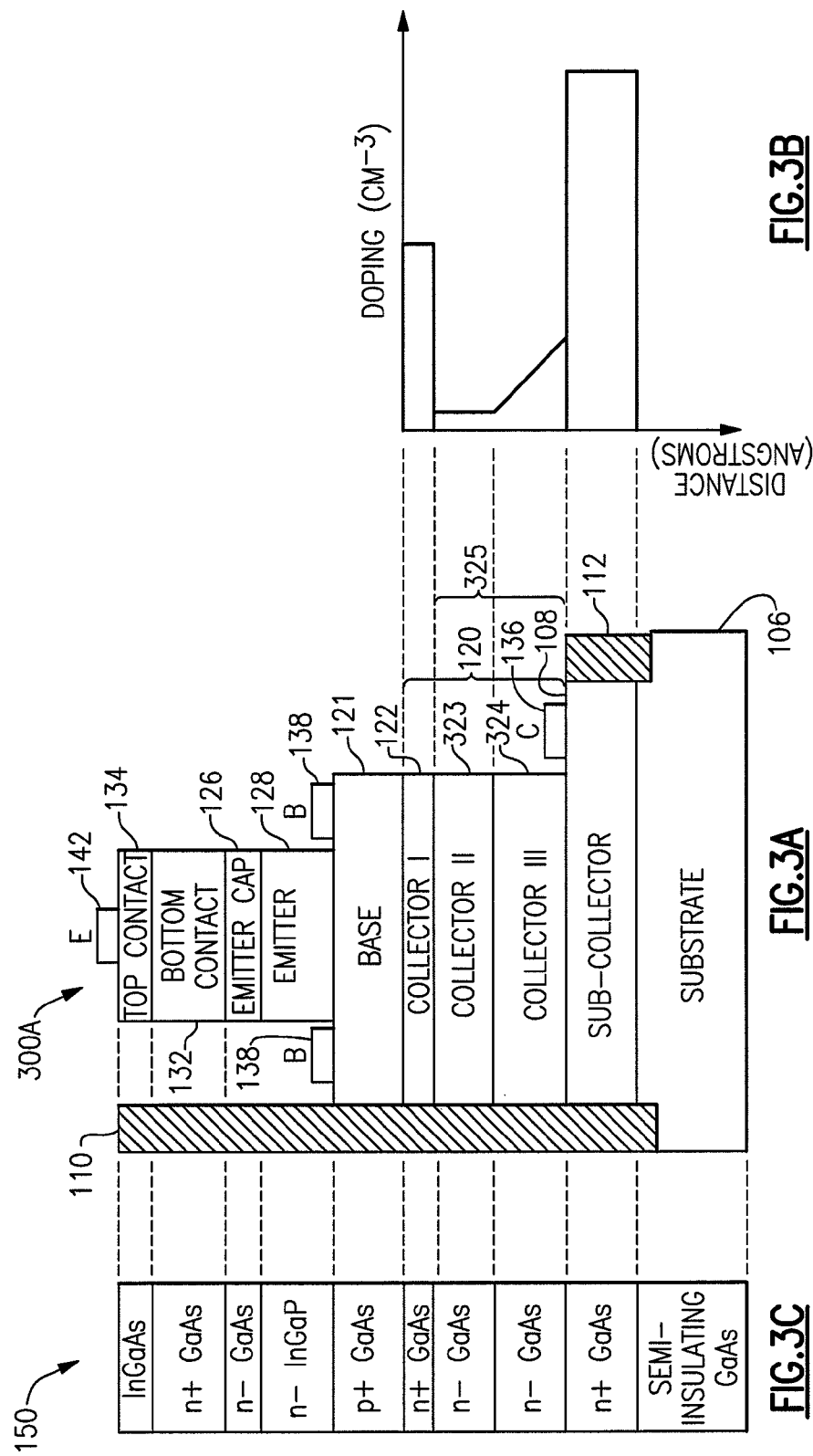

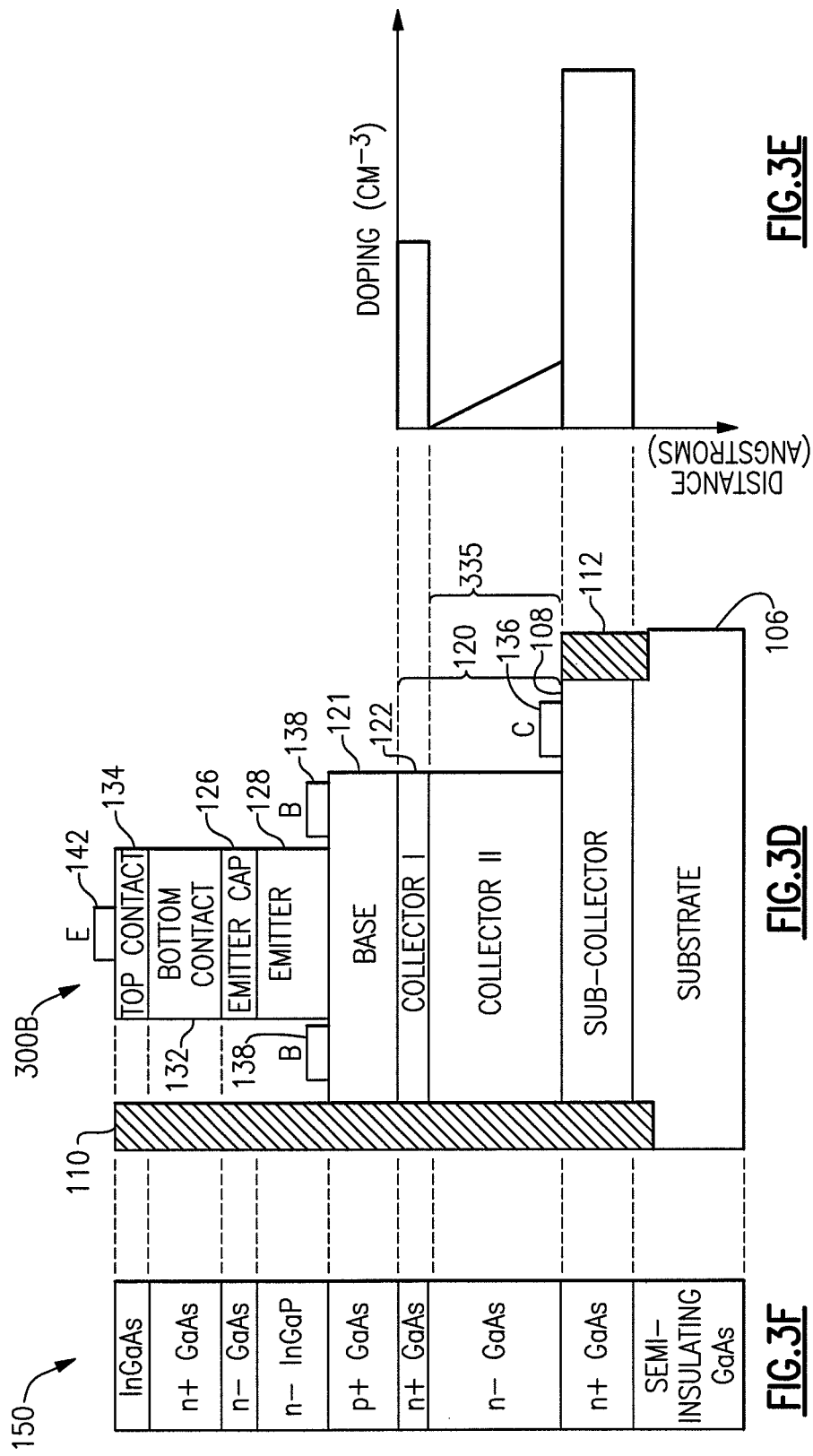

BIPOLAR TRANSISTOR HAVING COLLECTOR WITH GRADING

BACKGROUND

1. Technical Field

The present disclosure relates to the field of semiconductor structures and, more particularly, to bipolar transistors and products that include bipolar transistors.

2. Description of the Related Technology

Bipolar transistors, such as heterojunction bipolar transistors (HBTs), are implemented in a wide variety of applications. Such bipolar transistors can be formed on semiconductor substrates, such as gallium arsenide (GaAs) substrates. One illustrative application for a bipolar transistor is in a power amplifier system. As technology evolves, specifications for power amplifier systems have become more demanding to meet.

One aspect of power amplifier performance is linearity. Measures of linearity performance can include channel power ratios, such as an adjacent channel power ratio (ACPR1) and an alternative channel power ratio (ACPR2), and/or channel leakage power ratios, such as an adjacent channel leakage power ratio (ACLR1) and an alternative channel leakage power ratio (ACLR2). ACPR2 and ACLR2 can be referred to as second channel linearity measures. ACPR2 and ACLR2 values can correspond at measurements at an offset of about 1.98 MHz from a frequency of interest.

Conventionally, most publications have focused on ACPR1 and ACLR1 linearity measures and little has been published about ACRP2 or ACLR2. Recent ACPR2 and ACLR2 system specifications have been particularly difficult to meet, especially while meeting other system specifications related to RF gain. Accordingly, a need exists for improved linearity in systems that include bipolar transistors, such as power amplifier systems.

SUMMARY OF CERTAIN INVENTIVE ASPECTS

The innovations described in the claims each have several aspects, no single one of which is solely responsible for its desirable attributes. Without limiting the scope of this invention, some prominent features will now be briefly discussed.

One aspect of this disclosure is a bipolar transistor that includes a collector, a base disposed over the collector, and an emitter. The collector has a doping concentration of at least about $3 \times 10^{16}$ cm$^{-3}$ in a first collector region abutting the base. The collector also has an other collector region under the first collector region. The other collector region includes at least one grading in which doping concentration increases away from the first collector region.

In certain embodiments, the other collector region includes a first grading and a second grading in which doping concentration increases away from the base at a different rate than in the first grading. According to some of these embodiments, the bipolar transistor of can have an output power of at least about 29 dBm at a frequency within a frequency band centered around about 833 MHz. In accordance with a number of embodiments, the second grading of the bipolar transistor can be configured to increase Bv$_{CEX}$ of the bipolar transistor compared to the same transistor without the second grading at the same current density. In various embodiments, a doping concentration in the first grading grades from about an order of magnitude less than the doping concentration of the first collector region to less than the doping concentration of the first collector region. According to some of these embodiments, a doping concentration in the second grading grades from about a maximum doping concentration in the first grading to a doping concentration that is at least about one order of magnitude less than the doping concentration of a sub-collector below the second grading. In some embodiments, the first grading spans a second collector region proximate the first collector region and having a thickness that is more than approximately twice the thickness of the first collector region. According to certain embodiments, the second grading spans a third collector region having a thickness that is greater than the thickness of the first collector region and less than the thickness of the second collector region. In various embodiments, the collector consists essentially of the first collector region, the second collector region, and the third collector region. According to some embodiments, the bipolar transistor also includes a sub-collector under the collector. In accordance with certain embodiments, the first grading borders the second grading and doping concentration is approximately the same on both sides of the border of the first grading and the second grading.

In certain embodiments, a thickness of the first collector region is selected from a range of about 1000 Å to 2000 Å. According to some of these embodiments, the doping concentration of the first collector region is selected from a range of about $3 \times 10^{16}$ cm$^{-3}$ to $9 \times 10^{16}$ cm$^{-3}$.

According to a number of embodiments, the doping concentration in the first collector region is at least about $6 \times 10^{16}$ cm$^{-3}$.

In accordance with some embodiments, the base has a thickness of less than about 1400 Å. In some of these embodiments, the base has a doping concentration selected from a range of about $3.5 \times 10^{19}$ cm$^{-3}$ to $7 \times 10^{19}$ cm$^{-3}$.

In a number of embodiments, the bipolar transistor is a heterojunction bipolar transistor (HBT).

According to some embodiments, the bipolar transistor is a GaAs transistor.

Another aspect of this disclosure is a power amplifier module that includes a bipolar transistor. The bipolar transistor has a collector, a base, and an emitter. The collector has a doping concentration at a junction with the base such that the power amplifier has an alternative channel power ratio (ACPR2) of no greater than about −65 dBc. The collector also has at least a first grading in which doping concentration increases away from the base.

According to certain embodiments, the ACPR2 is no greater than about −65 dBc when the power amplifier operates within a frequency band centered around approximately 833 MHz.

In a number of embodiments, the collector also includes a second grading farther from the base than the first grading. The second grading is configured to increase Bv$_{CEX}$ of the bipolar transistor compared to the same transistor without the second grading at the same current density, according to some embodiments.

In accordance with a number of embodiments, the doping concentration in the collector at the junction with the base is at least about $3 \times 10^{16}$ cm$^{-3}$.

In certain embodiments, the collector includes a first region abutting the base having a substantially flat doping concentration of at least about $3 \times 10^{16}$ cm$^{-3}$ and a thickness selected from a range of about 1000 Å to 2000 Å. According to some of these embodiments, the doping concentration in the first region of the collector is selected in the range from about $3 \times 10^{16}$ cm$^{-3}$ to $9 \times 10^{16}$ cm$^{-3}$.

Another aspect of this disclosure is a power amplifier die that includes a bipolar transistor having a collector, a base abutting the collector, and an emitter. The collector has a doping concentration of at least about $3 \times 10^{16}$ cm$^{-3}$ at a junction with the base. The collector also has at least a first grading in which doping concentration increases away from the base.

Another aspect of this disclosure is a mobile device that includes an antenna, a battery, and a power amplifier. The power amplifier includes a heterojunction bipolar transistor having a collector, a base, and an emitter. The collector includes a first collector region abutting the base and having a first doping concentration of at least about $3 \times 10^{16}$ cm$^{-3}$. The collector also includes a second collector region proximate the first collector region and having a first grading in which doping concentration increases away from the base. The collector also includes a third collector region proximate the second collector region and having a second grading in which doping concentration increases away from the base at a different rate than the first grading. The first doping concentration, the first grading, and the second grading are configured to improve linearity of the power amplifier.

Yet another aspect of this disclosure is a method of forming a bipolar transistor. The method includes forming a sub-collector; forming a collector region with at least one grading having a doping concentration that decreases away from the sub-collector; and forming a different collector region adjacent abutting a base of the bipolar transistor and having a doping concentration of at least about $3 \times 10^{16}$ cm$^{-3}$ at an interface with the base.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 3A depicts an illustrative cross section of a bipolar transistor according to another embodiment.

FIG. 3B is a graph of example doping concentrations of portions of the bipolar transistor of FIG. 3A.

FIG. 3C is a legend illustrating example materials corresponding to portions of the bipolar transistor of FIG. 3A.

FIG. 3D depicts an illustrative cross section of a bipolar transistor according to another embodiment.

FIG. 3E is a graph of example doping concentrations of portions of the bipolar transistor of FIG. 3D.

FIG. 3F is a legend illustrating example materials corresponding to portions of the bipolar transistor of FIG. 3D.

DETAILED DESCRIPTION

Generally described, aspects of the present disclosure relate to a bipolar transistor having a high doping concentration (for example, at least about $3 \times 10^{16}$ cm$^{-3}$) in a first collector region abutting a base and at least one grading in another collector region adjacent the first collector region. A high doping concentration in a first collector region abutting a base of the bipolar transistor can improve second channel linearity measures, such as ACPR2 and/or ACLR2, in power amplifier systems. However, the high doping concentration in the first collector region can also decrease a gain of the bipolar transistor, such as the RF gain. To offset the decrease in the gain resulting from the high doping concentration in the first collector region, one or more gradings can be included in the other collector region to transition from the high doping concentration in the first collector region to a sub-collector. In some embodiments, the other collector region includes two different gradings in which doping concentration varies (for example, increases) at different rates away from the base. Properly selecting the grading(s) and the doping concentration in the first collector region can result in desirable RF gain and ruggedness characteristics of the bipolar transistor, especially compared to if the bipolar transistor included a flat doped or step doped collector structure.

Experimental data indicate that power amplifier systems that include such bipolar transistors can meet demanding second channel linearity specifications and also meet RF gain specifications. For instance, a power amplifier system including such a bipolar transistor can have an ACPR2 of no greater than about -65 dBc and an output power of at least about 29 dBm when operating at a frequency within a frequency band centered around approximately 833 MHz. In contrast, purely circuit design techniques that have been attempted to achieve desired levels of ACPR2 or ACLR2 have had limited success. Moreover, other bipolar transistors with enhanced ACPR2 and/or ACLR2 had degraded RF gain.

Figure 1:
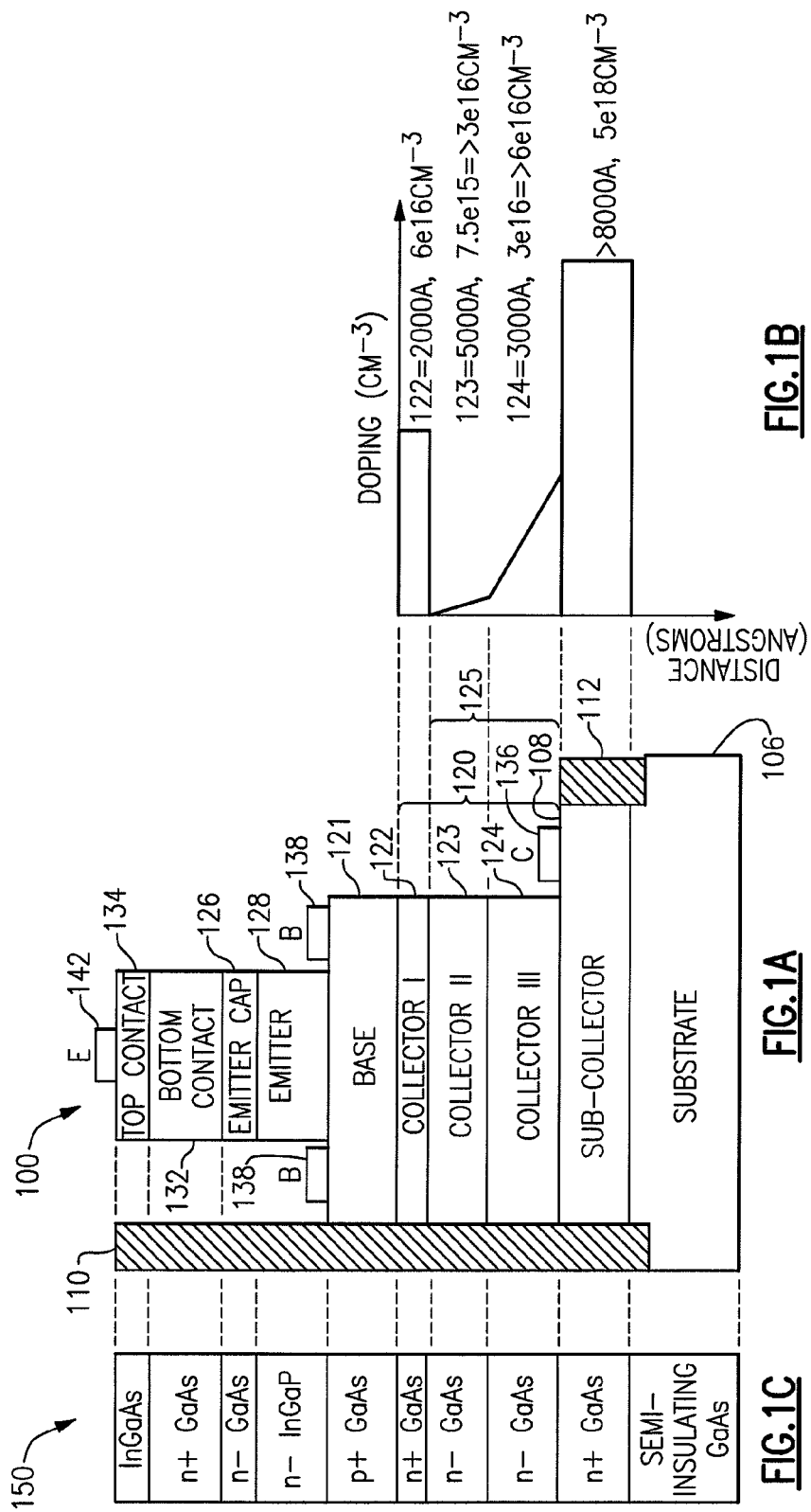
FIG. 1A depicts an illustrative cross section of a bipolar transistor according to an embodiment.
FIG. 1B is a graph of example doping concentrations of portions of the bipolar transistor of FIG. 1A.
FIG. 1C is a legend illustrating example materials corresponding to portions of the bipolar transistor of FIG. 1A.

FIG. 1A shows an illustrative cross section of a bipolar transistor 100 according to an embodiment. As illustrated, the bipolar transistor 100 is a heterojunction bipolar transistor (HBT). The bipolar transistor 100 can be formed on a substrate 106. The substrate 106 can be a semiconductor substrate, such as a GaAs substrate. The bipolar transistor 100 can be disposed between isolation regions 110 and 112. Isolation regions 110 and 112 are non-conductive regions that can provide electrical isolation between the bipolar transistor 100 and an adjacent transistor or other circuit element. Isolations regions 110 and 112 can each include, for example, a trench filled with nitride, polyimide, or other material suitable for electrical isolation. Although not shown, it will be understood that one or more buffer layers can be included between the substrate 106 and the sub-collector 108. The one or more buffer layers can include implant damaged material that renders such material semi-insulating.

The bipolar transistor 100 can include a collector 120, a base 121, and an emitter 128. The collector 120 can include a plurality of collection regions having different doping profiles. For instance, the collector 120 can include a first collector region 122 abutting the base 121 and an other collector region 125 that includes at least one grading in which doping concentration increases away from the first collector region 121. As illustrated in FIG. 1A, the other collector region 125 can include a second collector region 123 under the first collector region 122 and a third collector region 124 under the second collector region 123.

The first collector region 122 can abut the base 121 to form a collector-base junction. The collector-base junction can be a p-n junction. The first collector region 122 can include N+ doped GaAs. The first collector region 122 can be a flat doped region. Thus, within the first collector region 122, the doping concentration can be substantially constant. The doping concentration in the first collector region 122 at the collector-base interface of the bipolar transistor 100 can influence linearity of a system that includes the bipolar transistor 100. For instance, the doping concentration of the first collector region 122 together with the thickness of the first collector region 122 can influence ACPR2 and/or ACLR2 of a power amplifier system. Lower doping concentrations of the first collector region 122 together with smaller thickness of the first collector region 122 may not achieve a desired level of ACPR2 and/or ACLR2. On the other hand, higher doping concentrations of the first collector region 122 together with larger thickness of the first collector region 122 may degrade a gain of the bipolar transistor 100 such that a system including the bipolar transistor 100 does not meet gain specifications, such as RF gain specifications. In view of this trade-off, particular values of the doping concentration of the first collector region 122 and the thickness of the first collector region 122 may need to be selected to achieve both a desired gain and a desired linearity. As one example, for a GaAs bipolar transistor 100, FIG. 1B indicates that the first collector region 122 has a doping concentration of $6 \times 10^{16}$ cm$^{-3}$ and a thickness of 2000 Å.

The first collector region 122 can have a doping concentration that is selected to meet ACPR2 and/or ACLR2 specifications of a power amplifier system that includes the bipolar transistor 100. As one example, the first collector region 122 can have a doping concentration selected such that the a system that includes the bipolar transistor 100 has an ACPR2 of no greater than about −65 dBc and an output power of at least about 29 dBm when operating at a frequency within a frequency band centered around approximately 833 MHz. In some embodiments, the first collector region 122 can have a doping concentration selected such that the a system that includes the bipolar transistor 100 has an ACPR2 of no greater than about −55 dBc, no greater than about −57 dBc, no greater than about −60 dBc, no greater than about −62 dBc, no greater than about −65 dBc, no greater than about −67 dBc, no greater than about −70 dBc, no greater than about −72 dBc, or no greater than about −75 dBc. These values of ACPR2 can hold for an entire range of output power of the system and/or for one or more frequency bands of operation within the RF frequency range. As one example, to meet some ACPR2 and/or ACLR2 specifications, the first collector region 122 can have a doping concentration of at least about $3 \times 10^{16}$ cm$^{-3}$.

In some embodiments, the first collector region 122 can have a doping concentration of at least about $3 \times 10^{16}$ cm$^{-3}$, at least about $3.5 \times 10^{16}$ cm$^{-3}$, at least about $4 \times 10^{16}$ cm$^{-3}$, at least about $4.5 \times 10^{16}$ cm$^{-3}$, at least about $5 \times 10^{16}$ cm$^{-3}$, at least about $5.5 \times 10^{16}$ cm$^{-3}$, at least about $6 \times 10^{16}$ cm$^{-3}$, at least about $6.5 \times 10^{16}$ cm$^{-3}$, at least about $7 \times 10^{16}$ cm$^{-3}$, at least about $7.5 \times 10^{16}$ cm$^{-3}$, at least about $8 \times 10^{16}$ cm$^{-3}$, at least about $8.5 \times 10^{16}$ cm$^{-3}$, or at least about $9 \times 10^{16}$ cm$^{-3}$. According to certain embodiments, the first collector region 122 can have a doping concentration selected within one of the following ranges: about $3 \times 10^{16}$ cm$^{-3}$ to $9 \times 10^{16}$ cm$^{-3}$, about $3 \times 10^{16}$ cm$^{-3}$ to $8 \times 10^{16}$ cm$^{-3}$, about $3 \times 10^{16}$ cm$^{-3}$ to $7 \times 10^{16}$ cm$^{-3}$, about $3 \times 10^{16}$ cm$^{-3}$ to $6 \times 10^{16}$ cm$^{-3}$, about $3 \times 10^{16}$ cm$^{-3}$ to $5 \times 10^{16}$ cm$^{-3}$, about $4 \times 10^{16}$ cm$^{-3}$ to $9 \times 10^{16}$ cm$^{-3}$, about $4 \times 10^{16}$ cm$^{-3}$ to $8 \times 10^{16}$ cm$^{-3}$, about $4 \times 10^{16}$ cm$^{-3}$ to $7 \times 10^{16}$ cm$^{-3}$, about $4 \times 10^{16}$ cm$^{-3}$ to $6 \times 10^{16}$ cm$^{-3}$, about $4 \times 10^{16}$ cm$^{-3}$ to $5 \times 10^{16}$ cm$^{-3}$, about $5 \times 10^{16}$ cm$^{-3}$ to $9 \times 10^{16}$ cm$^{-3}$, about $5 \times 10^{16}$ cm$^{-3}$ to $8 \times 10^{16}$ cm$^{-3}$, about $5 \times 10^{16}$ cm$^{-3}$ to $7 \times 10^{16}$ cm$^{-3}$, about $5 \times 10^{16}$ cm$^{-3}$ to $6 \times 10^{16}$ cm$^{-3}$, about $6 \times 10^{16}$ cm$^{-3}$ to $9 \times 10^{16}$ cm$^{-3}$, about $6 \times 10^{16}$ cm$^{-3}$ to $8 \times 10^{16}$ cm$^{-3}$, about $6 \times 10^{16}$ cm$^{-3}$ to $7 \times 10^{16}$ cm$^{-3}$, about $7 \times 10^{16}$ cm$^{-3}$ to $9 \times 10^{16}$ cm$^{-3}$, about $7 \times 10^{16}$ cm$^{-3}$ to $8 \times 10^{16}$ cm$^{-3}$, or about $8 \times 10^{16}$ cm$^{-3}$ to $9 \times 10^{16}$ cm$^{-3}$.

The thickness of the first collector region 122 can be selected in the range from about 500 Å to 4000 Å in accordance with certain embodiments. In some of these embodiments, the thickness of the first collector region 122 can be selected within one of the following ranges: about 500 Å to 1000 Å, about 1000 Å to 2000 Å, about 1000 Å to 3000 Å, about 1500 Å to 2000 Å, about 2000 Å to 3000 Å, about 2000 Å to 4000 Å, about 2500 Å to 4000 Å, or about 3000 Å to 4000 Å. Any of these thickness ranges can be implemented in combination with any of the doping concentrations discussed earlier. In the bipolar transistor 100 of FIG. 1A, the thickness of the first collector region 122 can be measured as a shortest distance between the base 121 and the other collector region 125.

Higher doping concentrations in the first collector region 122 can reduce the RF gain of the bipolar transistor 100. In order to meet RF gain specifications of a system that includes the bipolar transistor 100, such as a power amplifier system, other changes to features of the bipolar transistor 100 may need to counteract such a decrease in RF gain. One or more gradings in the other collector region 125 of the bipolar transistor 100 can compensate for some or all of the losses in RF gain associated with a higher doping concentration in the first collector region 122. At the same time, ACPR2 and/or ACLR2 specifications of a power amplifier system that includes the bipolar transistor 100 can still be met.

The other collector region 125 can include multiple gradings in which doping varies at different rates. As illustrated in FIGS. 1A and 1B, the other collector region 125 can include a second collector region 123 having the first grading and a third collector region 124 having the second grading. In the first grading, the doping concentration can increase in a direction away from the base 121. The doping concentration can also increase in a direction away from the base 121 in the second grading. The doping concentration can increase at a different rate in the second grading than in the first grading. For instance, as illustrated in FIG. 1B, the doping concentration can increase at a greater rate in the second grading than in the first grading. In some other implementations, the first grading and the second grading can have respective doping concentrations that increase at substantially the same rate. For instance, there can be a discontinuity in doping concentration where the collector transitions from the first grading to the second grading and/or there can be a collector region with a flat doping between the first grading and the second grading. The first grading and/or the second grading can vary linearly or non-linearly (for example, parabolically). In the example illustrated in FIG. 1B, the first grading and the second grading can both have doping concentrations that vary linearly.

The second collector region 123 can include N− doped GaAs. The first grading can span the second collector region 123. The doping concentration in the second collector region 123 can increase away from the base 121 and the first collector region 122. In some embodiments, the doping concentration of the second collector region 123 adjacent the first collector region 122 can begin at a doping concentration that is about one order of magnitude lower than the doping concentration of the first collector region 121. For example, as shown in FIG. 1B, the doping concentration of the first collector region 121 can be about $6 \times 10^{16}$ cm$^{-3}$ and the lowest doping concentration of the second collector region can be about $7.5 \times 10^{15}$ cm$^{-3}$. As also shown in FIG. 1B, the second collector region 123 can have a thickness of about 5000 Å and the doping concentration can grade from about $7.5 \times 10^{15}$ cm$^{-3}$ at an interface with the first collector region 121 to $3\times10^{16}$ cm$^{-3}$ at an interface with the third collector region 124. In some embodiments, the doping concentration at the interface with the third collector region 124 can be substantially the same where the first grading meets the second grading. This can reduce discontinuities in capacitance associated with the collector 120. The first grading can reduce base to collector capacitance and consequently increase a gain, such as an RF gain, of the bipolar transistor 100.

The third collector region 124 can include N− doped GaAs. The second grading can span the third collector region 124. The doping concentration in the third collector region 124 can increase away from the second collector region 123. The doping concentration of the third collector region 124 adjacent the second collector region 123 can have a doping concentration that is approximately equal to the maximum doping concentration of the second collector region 123. As also shown in FIG. 1B, the second collector region 123 can have a thickness of about 3000 Å and the doping concentration can grade from about $3\times10^{16}$ cm$^{-3}$ at an interface with the second collector region 123 to $6\times10^{16}$ cm$^{-3}$ at an interface with the sub-collector 108. In some embodiments, the maximum doping concentration of the third collector region 124 can be about two orders of magnitude lower than the doping concentration of the sub-collector 108. For example, as shown in FIG. 1B, the maximum doping concentration of the third collector region 124 can be about $6\times10^{16}$ cm$^{-3}$ and the doping concentration of the sub-collector 108 can be about $5\times10^{18}$ cm$^{-3}$.

The doping concentration of the third collector region 124 at an interface with the sub-collector 108 can determine a breakdown voltage from collector to emitter with the base having a resistor coupled to a potential. Such a breakdown voltage can be referred to as "$BV_{CEX}$." A higher $BV_{CEX}$ can increase a safe operating region (SOA). Higher doping in the third collector region 124 at the interface with the sub-collector 108 can reduce the SOA. Doping the third collector region 124 at the interface with the sub-collector 108 too low can result in a breakdown current that is too steep, thereby reducing robustness of the bipolar transistor 100. In certain embodiments, the doping concentration in the third collector region 124 at the interface with the sub-collector 108 can be selected in the range from about $5\times10^{16}$ cm$^{-36}$ to $9\times10^{16}$ cm$^{-3}$. Such doping concentrations can result in desirable $BV_{CEX}$ values for the bipolar transistor 100 and/or a desirable SOA. More detail regarding $BV_{CEX}$ values associated with the bipolar transistor 100 will be provided with reference to FIG. 2.

The base 121 can include P+ doped GaAs. The base 121 can be thinner and/or have a higher doping concentration than bases in other bipolar transistors used in power amplifier systems. Reducing the thickness of the base 121 and increasing the doping concentration of the base 121 can increase the RF gain and keep the DC gain substantially the same. For example, in certain implementations, the doping concentration of the base 121 can be selected in a range from about $2\times10^{19}$ cm$^{-3}$ to $7\times10^{19}$ cm$^{-3}$. The thickness of the base 121 can be selected in the range from about 350 Å to 1400 Å according to certain implementations. In some implementations, the thickness of the base 121 can be selected in the range from about 500 Å to 900 Å. Any base thicknesses selected from the ranges disclosed herein can be implemented in combination with any of the base doping concentrations selected from the ranges disclosed herein. As one example, the base 121 can have a doping concentration of $5.5\times10^{19}$ cm$^{-3}$ and a thickness of 500 Å. In the bipolar transistor 100 of FIG. 1A, thickness can be the shortest distance between the emitter 128 and the first collector region 121.

The product of the doping and the thickness of the base 121 can be referred to as a "Gummel number." In some embodiments, the Gummel number can be approximately constant such that the bipolar transistor 100 can have an approximately constant beta value. For example, increasing the thickness of the base 121 within a selected range can be accompanied by a corresponding decrease in doping concentration of the base 121 to hold the Gummel number approximately constant. As another example, decreasing the thickness of the base 121 within a selected range can be accompanied by a corresponding increase in doping concentration of the base 121 to hold the Gummel number approximately constant. Reducing the thickness of the base 121 and increasing the doing of the base 121 can result in insignificant changes in resistance associated with the base 121. For instance, changing the thickness of the base 121 from 900 Å to 500 Å and changing the doping concentration of the base 121 from $4\times10^{19}$ cm$^{-3}$ to $5.5\times10^{19}$ cm$^{-3}$ may not have a significant effect on resistance of the base 121.

The bipolar transistor 100 can include a collector contact 136 to the collector, base contact(s) 138 to the base 121, and an emitter contact 142 to the emitter 126. These contacts can provide an electrical connection to and/or from the bipolar transistor 100. The contacts 136, 138, and 142 can be formed of any suitable conductive material. As illustrated in FIG. 1A, the emitter contact 142 can be disposed over a top contact 134, a bottom contact 132, and an emitter cap 126.

The bipolar transistor 100 can include a sub-collector 120 over the substrate 106. The sub-collector 120 can be under the other collector region 125. For example, as illustrated in FIG. 1A, the sub-collector 120 can be disposed between the third collector region 124 and the substrate 108. The sub-collector 120 can abut the third collector region 124. The sub-collector 120 can be a flat doped region. In some embodiments, the doping concentration of the sub-collector 120 can be at least one or two orders of magnitude higher than the highest doping concentration of the third collector region 124. As shown in FIG. 1B, the sub-collector 120 can have a doping concentration on the order of $5\times10^{18}$ cm$^{-3}$ and have a thickness of at least about 8000 Å in certain embodiments. The collector contact 136 physically contacting the sub-collector 120 can provide an electrical connection to the collector 120.

FIG. 1C is a legend 150 illustrating example materials corresponding to portions of the bipolar transistor 100 of FIG. 1A. Dashed lines between FIG. 1A and FIG. 1C are included to indicate that materials in the legend 150 correspond to particular portions of the bipolar transistor 100. The legend 150 indicates that, in certain embodiments, the substrate 108 can be semi-insulating GaAs, the sub-collector 120 can be N+ GaAs, the third collector region 124 can be N− GaAs, the second collector region 123 can be N− GaAs, the first collector region 122 casn be N+ GaAs, the base 121 can be P+ GaAs, the emitter 128 can be N− InGaP, the emitter cap 126 can be N− GaAs, the bottom contact 132 can be N+ GaAs, and the top contact 134 can be InGaAs. It will be understood that in some embodiments, one or more of the regions of the bipolar transistor 100 can include a suitable alternative material instead of the example materials provided in the legend 150. Moreover, in any of the bipolar transistors described herein n-type doping and p-type doping can be interchanged throughout some or all of the transistor. Thus, any combination of features described herein can be applied to NPN transistors and/or PNP transistors.

Experimental data indicate that a power amplifier system including the bipolar transistor 100 of FIG. 1A has met currently linearity specifications, including ACPR2 and ACLR2, and RF gain specifications that have been particularly challenging to meet. Moreover, experimental data indicate that the bipolar transistor 100 of FIG. 1A has desirable ruggedness qualities, for example, as indicated by $BV_{CEX}$ values and the safe operating region (SOA).

Figure 2:
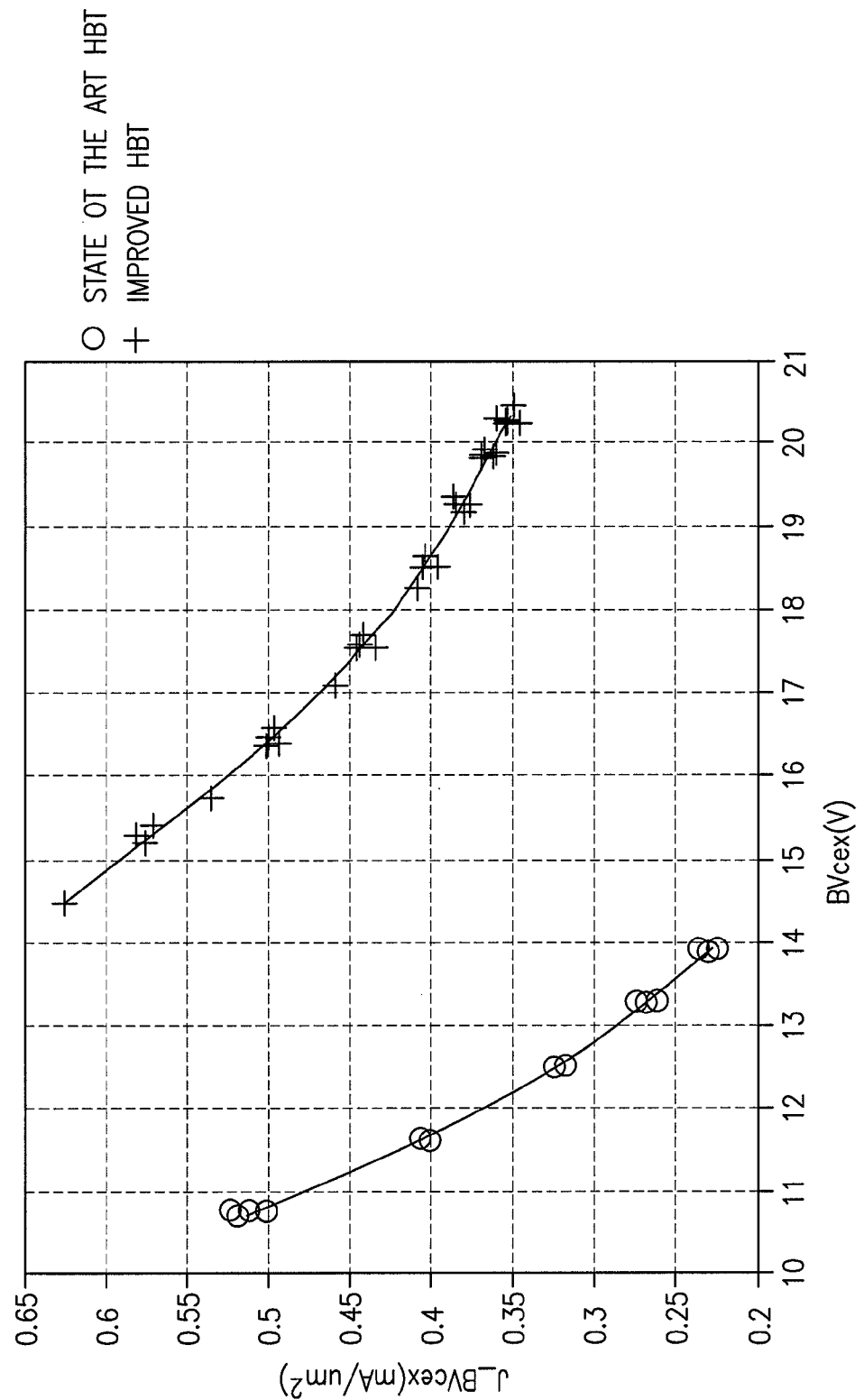
FIG. 2 is a graph that illustrates relationships between breakdown voltage and current density for the bipolar transistor of FIG. 1A and a state of the art bipolar transistor.

FIG. 2 is a graph that illustrates relationships between $BV_{CEX}$ and current density for the bipolar transistor 100 of FIG. 1A and a conventional bipolar transistor. In FIG. 2, "+" symbols represent data corresponding to the bipolar transistor 100 and "o" symbols represent data corresponding to a current, state of the art bipolar transistor. As mentioned earlier, $BV_{CEX}$ can represent a breakdown voltage from collector to emitter in a bipolar transistor with the base having a resistor coupled to a potential.

In FIG. 2, the SOA is represented by the area below the illustrated $BV_{CEX}$ curves. When a bipolar transistor operates at a voltage and current density corresponding to its $BV_{CEX}$ curve, the bipolar transistor reaches a point at which it breaks down. Moreover, when a bipolar transistor operates at a voltage and current density that are above its corresponding $BV_{CEX}$ curve, the bipolar transistor breaks down.

The data in FIG. 2 indicate that the bipolar transistor 100 operates within the SOA when operating at voltages below a $BV_{CEX}$ value on the corresponding $BV_{CEX}$ curve at a particular current density. The data in FIG. 2 also indicate that the bipolar transistor 100 operates within the SOA when operating at current densities below the current density on the corresponding $BV_{CEX}$ at particular voltage level. Further, so long as a voltage and current density combination is below the $BV_{CEX}$ curve, the bipolar transistor should operate within the SOA. As shown in FIG. 2, the bipolar transistor 100 has a larger SOA than the conventional bipolar transistor. The bipolar transistor 100 has increased ruggedness compared to the conventional bipolar transistor because it has a larger SOA and can operate at higher current densities and voltages without breaking down. Thus, the bipolar transistor 100 has desirable ruggedness characteristics.

FIG. 3A depicts an illustrative cross section of a bipolar transistor 300A according to another embodiment. The bipolar transistor 300A of FIG. 3A is substantially the same as the bipolar transistor 100 of FIG. 1A except the other collector region 325 of FIG. 3A is different from the other collector region 125 of FIG. 1A. More specifically, the other collector region 325 has a different doping profile than the other collector region 125. FIG. 3B is a graph that shows illustrative doping concentrations of portions of the bipolar transistor 300A of FIG. 3A.

The bipolar transistor 300A can include a collector 120 having a first collector region 122 and an other collector region 325. The first collector region 122 can include any combination of features described with reference to the first collector region 122 of FIG. 1A. The other collector region 325 can include a single grading in which doping concentration varies (for example, increases) away from the base 121.

In order to meet RF gain specifications of a system, such as a power amplifier system, that includes the bipolar transistor 300A, the single grading in the other collector region 325 of the bipolar transistor 300A can compensate for some or all of the losses in RF gain associated with a higher doping concentration in the first collector region 122. At the same time, ACPR2 and/or ACLR2 specifications of a power amplifier system that includes the bipolar transistor 300A can still be met. The other collector region 325 can include a second collector region 323 and a third collector region 324 as illustrated in FIGS. 3A and 3B. In other embodiments, for example, as shown in FIGS. 3D-3F, the flat doped portion can be omitted from the other collector region 325.

As illustrated in FIGS. 3A and 3B, the other collector region 325 can include a second collector region 323 having a flat doping. The second collector region 323 can include N– doped GaAs. In some embodiments, the doping concentration of the second collector region 323 has at a doping concentration that is about one order of magnitude lower than the doping concentration of the first collector region 121. According to certain embodiments, the doping concentration of the second collector region can be selected from the range of about $7.5 \times 10^{15}$ cm$^{-3}$ to $1.5 \times 10^{16}$ cm$^{-3}$. The second collector region 323 can have a thickness selected from the range from about 2000 Å to 4000 Å. In some embodiments, the doping concentration of the second collector region 323 can be approximately equal to the doping concentration at which the third collector region 324 begins to grade. This can reduce discontinuities in capacitance associated with the collector 120.

The third collector region 324 can include N– doped GaAs. The single grading can span the third collector region 324. In other embodiments, for example, as shown in FIGS. 3D-3F, the single grading can span the other collector region 335. The doping concentration in the third collector region 324 can increase away from the base 121, the first collector region 121, and/or the second collector region 323. The doping concentration of the third collector region 324 adjacent the second collector region 323 can have a doping concentration that is approximately equal to the doping concentration of the second collector region 323. The third collector region 324 can have a thickness selected from the range from about 4000 Å to 7000 Å. The doping concentration in the third collector region 324 can grade from about $7.5 \times 10^{15}$ cm$^{-3}$ at an interface with the second collector region 323 to at least about $5 \times 10^{16}$ cm$^{-3}$ at an interface with the sub-collector 108. In some embodiments, the maximum doping concentration of the third collector region 324 can be about two orders of magnitude lower than the doping concentration of the sub-collector 108.

The doping concentration of the third collector region 324 at an interface with the sub-collector 108 can determine $BV_{CEX}$. Higher doping in the third collector region 324 at the interface with the sub-collector 108 can reduce the SOA. Doping the third collector region 324 at the interface with the sub-collector 108 too low can result in a breakdown current that is too steep, thereby reducing robustness of the bipolar transistor 300A. In certain embodiments, the doping concentration in the third collector region 324 at the interface with the sub-collector 108 can be selected in the range from about $5 \times 10^{16}$ cm$^{-3}$ to $9 \times 10^{16}$ cm$^{-3}$. Such doping concentrations can result in desirable $BV_{CEX}$ values for the bipolar transistor 300A and/or a desirable SOA.

As shown in the legend 150 of FIG. 3C, the bipolar transistor 300A can be formed of substantially the same materials as the bipolar transistor 100, with a different doping profile in the collector 120.

FIG. 3D depicts an illustrative cross section of a bipolar transistor 300B according to another embodiment. The bipolar transistor 300B of FIG. 3D is substantially the same as the bipolar transistor 300A of FIG. 3A except the other collector region 335 of FIG. 3D is different from the other collector region 325 of FIG. 3A. More specifically, a grading spans the other collector region 335. The collector 120 of the bipolar transistor 300B can consist of the first collector region 122 and the other collector region 335. As illustrated in FIG. 3D, the collector 120 of the bipolar transistor 300B only includes the first collector region 122 and the second other collector region 335. FIG. 3B is a graph that shows illustrative doping concentrations of portions of the bipolar transistor 300B of FIG. 3A. As shown in the legend 150 of FIG. 3F, the bipolar transistor 300B can be formed of substantially the same materials as the bipolar transistor 100 and/or the bipolar transistor 300A, with a different doping profile in the collector 120.

The bipolar transistor 300B can include a collector 120 having a first collector region 122 and an other collector region 335. The first collector region 122 can include any combination of features described with reference to the first collector region 122 of FIG. 1A. The other collector region 335 can include a single grading in which doping concentration varies (for example, increases) away from the base 121 and spans the entire other collector region 335.

In order to meet RF gain specifications of a system, such as a power amplifier system, that includes the bipolar transistor 300B, the single grading in the other collector region 335 of the bipolar transistor 300B can compensate for some or all of the losses in RF gain associated with a higher doping concentration in the first collector region 122. At the same time, ACPR2 and/or ACLR2 specifications of a power amplifier system that includes the bipolar transistor 300B can still be met. The grading in the other collector region 335 can increase $BV_{CEX}$ and/or SOA of the bipolar transistor 330B. For instance, in certain embodiments, the doping concentration in the other collector region 335 can have a doping concentration at the interface with the sub-collector 108 can be selected in the range from about $5 \times 10^{16}$ cm$^{-3}$ to $9 \times 10^{16}$ cm$^{-3}$. The other collector region 335 can have any suitable thickness or grading described herein to achieve one or more features described herein. In some embodiments, the other collector region can have a thickness selected from the range from about 4000 Å to 7000 Å. According to certain embodiments, the grading in the other collector 335 can grade from about $7.5 \times 10^{15}$ cm$^{-3}$ at an interface with the first collector region 122 to at least about $5 \times 10^{16}$ cm$^{-3}$ at an interface near or at the sub-collector 108.

Figure 4:
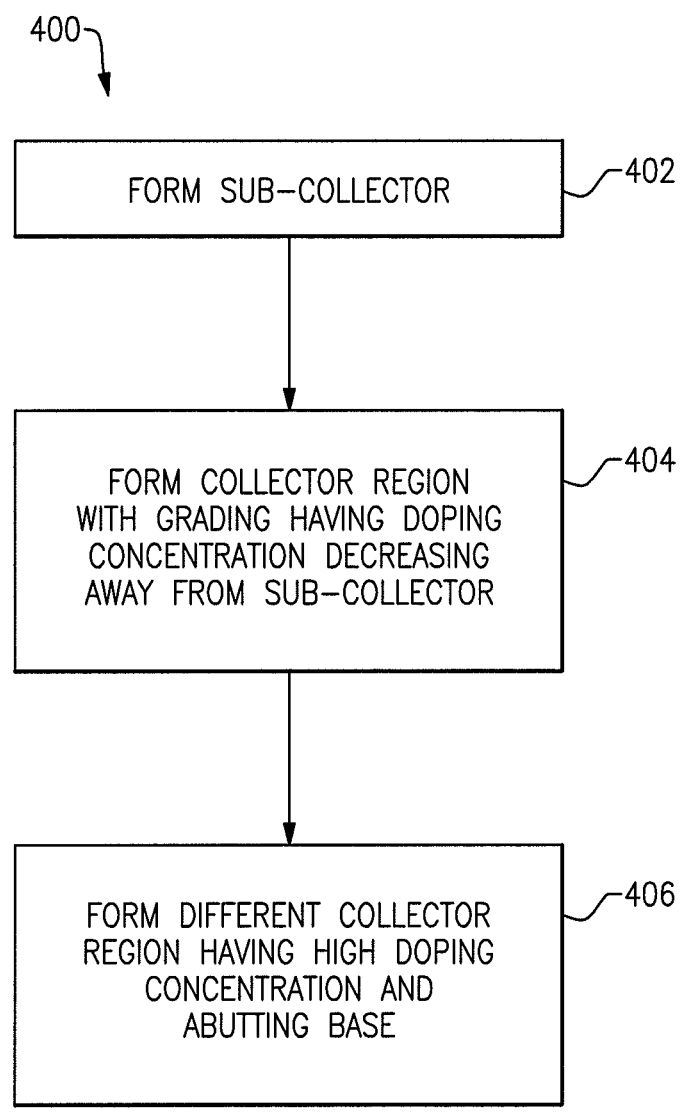
FIG. 4 is an illustrative flow diagram of making a bipolar transistor according to an embodiment.

FIG. 4 is an illustrative flow diagram of a process 400 of forming a bipolar transistor according to an embodiment. It will be understood that any of the processes discussed herein may include greater or fewer operations and the operations may be performed in any order, as appropriate. Further, one or more acts of the process can be performed either serially or in parallel. The process 400 can be performed while forming the bipolar transistor 100 of FIG. 1A, the bipolar transistor 300A of FIG. 3A, the bipolar transistor 300B of FIG. 3D, or any combination thereof. At block 402, a sub-collector of a bipolar transistor is formed. The sub-collector can include any combination of features of the sub-collectors described herein, for example, the sub-collector 108. A collector region can be formed that includes at least one grading at block 404. The at least one grading can be formed by any suitable doping method known in the art. The collector region can be adjacent the sub-collector, for example, the directly over the sub-collector in the orientation of FIGS. 1A, 3A, and 3D. The collector region can include any combination of features described herein with reference to the other collector regions 125, 325, and/or 335. For instance, the collector region can have two gradings in some embodiments. The at least one grading of the collector region can increase the RF gain of the bipolar transistor and/or increase the ruggedness of the bipolar transistor. For example, the at least one grading can compensate for some or all of the decrease in gain of the bipolar transistor that results from the high doping concentration in the first collector region. A different collector region having a high doping concentration can be formed abutting the base at block 406. The high doping concentration can be any of the doping concentrations of the first collector region 122 described herein, for example, at least about $3.0 \times 10^{16}$ cm$^{-3}$. Moreover, the high doping concentration and the thickness of the first collector region can together improve one or more second channel linearity measures.

Figure 5:
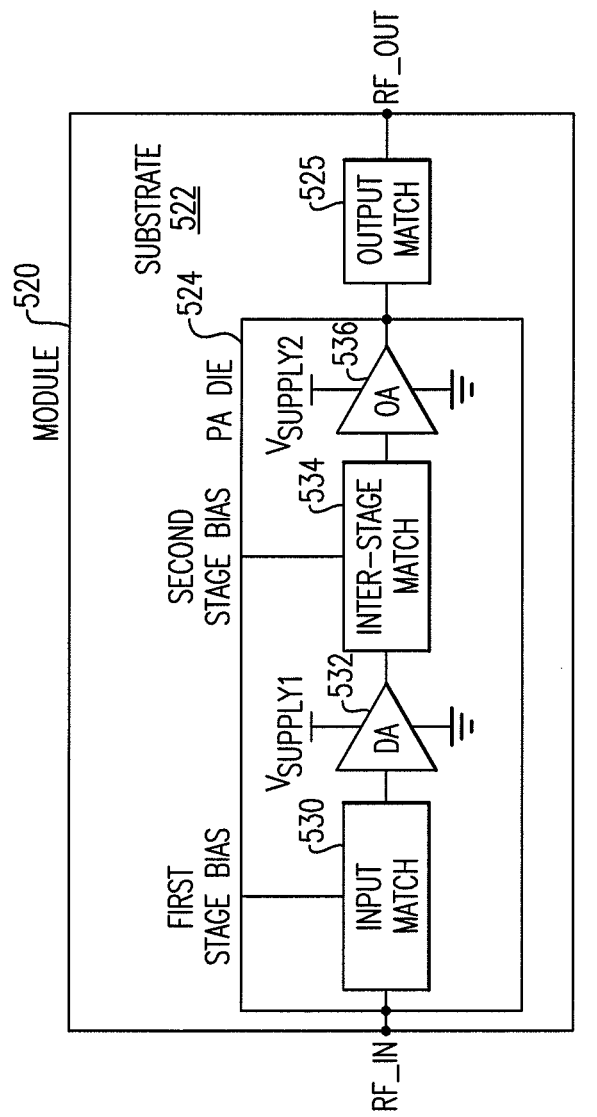
FIG. 5 is an illustrative block diagram of a power amplifier module that includes a bipolar transistor with one or more features described herein.

FIG. 5 is a schematic block diagram of a module 520 that can include one or more bipolar transistors 100 of FIG. 1A, one or more bipolar transistors 300A of FIG. 3A, one or more bipolar transistors 300B of FIG. 3D, or any combination thereof. The module 520 can be some or all of a power amplifier system. The module 520 can be referred to as multi-chip module and/or a power amplifier module in some implementations. The module 520 can include a substrate 522 (for example, a packaging substrate), a die 524 (for example, a power amplifier die), a matching network 525, the like, or any combination thereof. Although not illustrated, the module 520 can include one or more other dies and/or one or more circuit elements that coupled to the substrate 522 in some implementations. The one or more other dies can include, for example, a controller die, which can include a power amplifier bias circuit and/or a direct current-to-direct current (DC-DC) converter. Example circuit element(s) mounted on the packaging substrate can include, for example, inductor(s), capacitor(s), impedance matching network(s), the like, or any combination thereof.

The module 520 can include a plurality of dies and/or other components mounted on and/or coupled to the substrate 522 of the module 520. In some implementations, the substrate 522 can be a multi-layer substrate configured to support the dies and/or components and to provide electrical connectivity to external circuitry when the module 520 is mounted on a circuit board, such as a phone board.

The power amplifier die 524 can receive a RF signal at an input pin RF_IN of the module 520. The power amplifier die 524 can include one or more power amplifiers, including, for example, multi-stage power amplifiers configured to amplify the RF signal. The power amplifier die 524 can include an input matching network 530, a first stage power amplifier 532 (which can be referred to as a driver amplifier (DA)), an inter-stage matching network 534, a second stage power amplifier 536 (which can be referred to as an output amplifier (OA)), or any combination thereof.

A power amplifier can include the first stage power amplifier 532 and the second stage power amplifier 536. The first stage power amplifier 532 and/or the second stage power amplifier 536 can include one or more bipolar transistors 100 of FIG. 1A, one or more bipolar transistors 300A of FIG. 3A, one or more bipolar transistors 300B of FIG. 3D, or any combination thereof. Moreover, the bipolar transistor 100 of FIG. 1A, the bipolar transistor 300A of FIG. 3A and/or the bipolar transistor 300B of FIG. 3D can help meet the power module 520 and/or the power amplifier die 524 to meet any of the linearity and/or RF gain specifications described herein.

The RF input signal can be provided to the first stage power amplifier 532 via the input matching network 530. The matching network 530 can receive a first stage bias signal. The first bias signal can be generated on the PA die 524, outside of the PA die 524 in the module 520, or external to the module 520. The first stage power amplifier 532 can amplify the RF input and provide the amplified RF input to the second stage power amplifier 536 via the inter-stage matching circuit 534. The inter-stage matching circuit 534 can receive a second stage bias signal. The second stage bias signal can be generated on the PA die 524, outside of the PA die 524 in the module 520, or external to the module 520. The second stage power amplifier 536 can generate the amplified RF output signal.

The amplified RF output signal can be provided to an output pin RF_OUT of the power amplifier die 524 via an output matching network 525. The matching network 525 can be provided on the module 520 to aid in reducing signal reflections and/or other signal distortions. The power amplifier die 524 can be any suitable die. In some implementations, the power amplifier 524 die is a gallium arsenide (GaAs) die. In some of these implementations, the GaAs die has transistors formed using a heterojunction bipolar transistor (HBT) process.

The module 520 can also include a one or more power supply pins, which can be electrically connected to, for example, the power amplifier die 524. The one or more power supply pins can provide supply voltages to the power amplifiers, such as $V_{SUPPLY1}$ and $V_{SUPPLY2}$, which can have different voltage levels in some implementations. The module 520 can include circuit element(s), such as inductor(s), which can be formed, for example, by a trace on the multi-chip module. The inductor(s) can operate as a choke inductor, and can be disposed between the supply voltage and the power amplifier die 524. In some implementations, the inductor(s) are surface mounted. Additionally, the circuit element(s) can include capacitor(s) electrically connected in parallel with the inductor(s) and configured to resonate at a frequency near the frequency of a signal received on the pin RF_IN. In some implementations, the capacitor(s) can include a surface mounted capacitor.

The module 520 can be modified to include more or fewer components, including, for example, additional power amplifier dies, capacitors and/or inductors. For instance, the module 520 can include one or more additional matching networks 525. As another example, the module 520 can include an additional power amplifier die, as well as an additional capacitor and inductor configured to operate as a parallel LC circuit disposed between the additional power amplifier die and the power supply pin of the module 520. The module 520 can be configured to have additional pins, such as in implementations in which a separate power supply is provided to an input stage disposed on the power amplifier die 520 and/or implementations in which the module 520 operates over a plurality of bands.

The module 520 can have a low voltage positive bias supply of about 3.2 V to 4.2 V, good linearity (for example, meeting any of the second channel linearity specification described herein), high efficiency (for example, PAE of approximately 40% at 28.25 dBm), large dynamic range, a small and low profile package (for example, 3 mm×3 mm×0.9 mm with a 10-pad configuration), power down control, support low collector voltage operation, digital enable, not require a reference voltage, CMOS compatible control signals, an integrated directional coupler, or any combination thereof.

In some implementations, the module 520 is a power amplifier module that is a fully matched 10-pad surface mount module developed for Wideband Code Division Multiple Access (WCDMA) applications. This small and efficient module can pack full 1920-1980 MHz bandwidth coverage into a single compact package. Because of high efficiencies attained throughout the entire power range, the module 520 can deliver desirable talk-time advantages for mobile phones. The module 520 can meet the stringent spectral linearity requirements of High Speed Downlink Packet Access (HSDPA), High Speed Uplink Packet Access (HSUPA), and Long Term Evolution (LTE) data transmission with high power added efficiency. A directional coupler can be integrated into the module 520 and can thus eliminate the need for an external coupler.

The die 524 can be a power amplifier die embodied in a single Gallium Arsenide (GaAs) Microwave Monolithic Integrated Circuit (MMIC) that includes all active circuitry of the module 520, such as one or more the bipolar transistors 100 of FIG. 1A, one or more bipolar transistors 300A of FIG. 3A, one or more bipolar transistors 300B of FIG. 3D, or any combination thereof. The MMIC can include on-board bias circuitry, as well as input matching network 530 and interstage matching network 534. An output matching network 525 can have a 50 ohm load that is embodied separate from the die 524 within the package of the module 520 to increase and/or optimize efficiency and power performance.

The module 520 can be manufactured with a GaAs Heterojunction Bipolar Transistor (HBT) BiFET process that provides for all positive voltage DC supply operation while maintaining high efficiency and good linearity (for example, meeting any of the second channel linearity specification described herein). Primary bias to the module 520 can be supplied directly or via an intermediate component from any three-cell Ni—Cd battery, a single-cell Li-Ion battery, or other suitable battery with an output in the range selected from about 3.2 to 4.2 V. No reference voltage is needed in some implementations. Power down can be accomplished by setting an enable voltage to zero volts. No external supply side switch is needed as typical "off" leakage is a few microamperes with full primary voltage supplied from the battery, according to some implementations.

Figure 6:
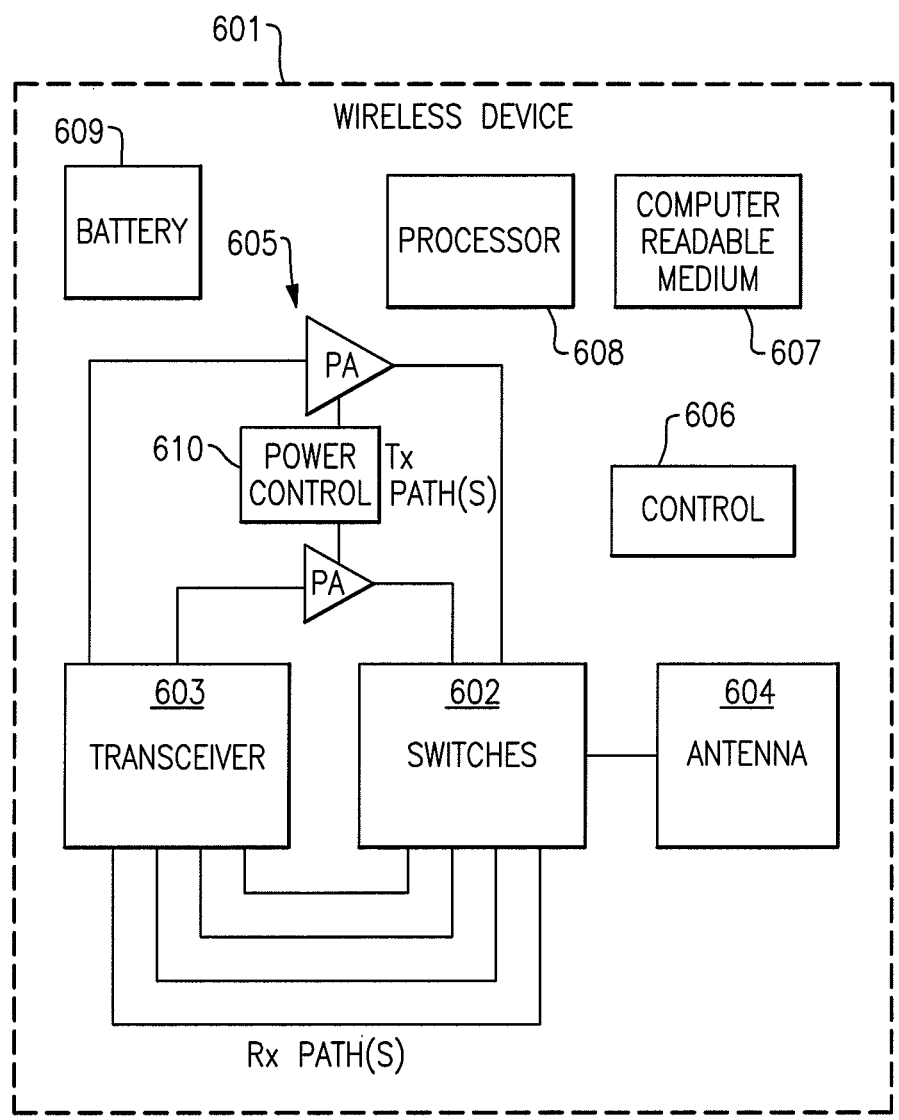
FIG. 6 is an illustrative block diagram of a mobile device that includes the power amplifier module of FIG. 5.

Any of the devices, systems, methods, and apparatus described herein can be implemented in a variety of electronic devices, such as a mobile device, which can also be referred to as a wireless device. FIG. 6 is a schematic block diagram of an example mobile device 601 that can include one or more bipolar transistors 100 of FIG. 1A, one or more bipolar transistors 300A of FIG. 3A, one or more bipolar transistors 300B of FIG. 3D, or any combination thereof.

Examples of the mobile device 601 can include, but are not limited to, a cellular phone (for example, a smart phone), a laptop, a tablet computer, a personal digital assistant (PDA), an electronic book reader, and a portable digital media player. For instance, the mobile device 101 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the mobile device 601 can include one or more of a switching component 602, a transceiver component 603, an antenna 604, power amplifiers 605 that can include one or more bipolar transistors 100 of FIG. 1A, one or more bipolar transistors 300A of FIG. 3A, one or more bipolar transistors 300B of FIG. 3D, a control component 606, a computer readable medium 607, a processor 608, a battery 609, and supply control block 610.

The transceiver component 603 can generate RF signals for transmission via the antenna 604. Furthermore, the transceiver component 603 can receive incoming RF signals from the antenna 604.

It will be understood that various functionalities associated with the transmission and receiving of RF signals can be achieved by one or more components that are collectively represented in FIG. 6 as the transceiver 603. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 6 as the antenna 604. For example, a single antenna can be configured to provide both transmitting and receiving functionalities. In another example, transmitting and receiving functionalities can be provided by separate antennas. In yet another example, different bands associated with the mobile device 601 can be provided with different antennas.

In FIG. 6, one or more output signals from the transceiver 603 are depicted as being provided to the antenna 604 via one or more transmission paths. In the example shown, different transmission paths can represent output paths associated with different bands and/or different power outputs. For instance, the two example power amplifiers 605 shown can represent amplifications associated with different power output configurations (e.g., low power output and high power output), and/or amplifications associated with different bands.

In FIG. 6, one or more detected signals from the antenna 604 are depicted as being provided to the transceiver 603 via one or more receiving paths. In the example shown, different receiving paths can represent paths associated with different bands. For example, the four example paths shown can represent quad-band capability that some mobile devices 601 are provided with.

To facilitate switching between receive and transmit paths, the switching component 602 can be configured to electrically connect the antenna 604 to a selected transmit or receive path. Thus, the switching component 602 can provide a number of switching functionalities associated with an operation of the mobile device 601. In certain embodiments, the switching component 602 can include a number of switches configured to provide functionalities associated with, for example, switching between different bands, switching between different power modes, switching between transmission and receiving modes, or some combination thereof. The switching component 602 can also be configured to provide additional functionality, including filtering of signals. For example, the switching component 602 can include one or more duplexers.

The mobile device 601 can include one or more power amplifiers 605. RF power amplifiers can be used to boost the power of a RF signal having a relatively low power. Thereafter, the boosted RF signal can be used for a variety of purposes, including driving the antenna of a transmitter. Power amplifiers 605 can be included in electronic devices, such as mobile phones, to amplify a RF signal for transmission. For example, in mobile phones having a an architecture for communicating under the 3G and/or 4 G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 6 shows that in certain embodiments, a control component 606 can be provided, and such a component can include circuitry configured to provide various control functionalities associated with operations of the switching component 602, the power amplifiers 605, the supply control 610, and/or other operating component(s).

In certain embodiments, a processor 608 can be configured to facilitate implementation of various functionalities described herein. Computer program instructions associated with the operation of any of the components described herein may be stored in a computer-readable memory 607 that can direct the processor 608, such that the instructions stored in the computer-readable memory produce an article of manufacture including instructions which implement the various operating features of the mobile devices, modules, etc. described herein.

The illustrated mobile device 601 also includes the supply control block 610, which can be used to provide a power supply to one or more power amplifiers 605. For example, the supply control block 610 can include a DC-to-DC converter. However, in certain embodiments the supply control block 610 can include other blocks, such as, for example, an envelope tracker configured to vary the supply voltage provided to the power amplifiers 605 based upon an envelope of the RF signal to be amplified.

The supply control block 610 can be electrically connected to the battery 609, and the supply control block 610 can be configured to vary the voltage provided to the power amplifiers 605 based on an output voltage of a DC-DC converter. The battery 609 can be any suitable battery for use in the mobile device 601, including, for example, a lithium-ion battery. With at least one power amplifier 605 that includes one or more bipolar transistors 100 of FIG. 1A, one or more bipolar transistors 300A of FIG. 3A, one or more bipolar transistors 300B of FIG. 3D, or any combination thereof, the power consumption of the battery 109 can be reduced and/or the reliability of the power amplifier 605 can be improved, thereby improving performance of the mobile device 601.

Some of the embodiments described above have provided examples in connection with modules and/or electronic devices that include power amplifiers, such as mobile phones. However, the principles and advantages of the embodiments can be used for any other systems or apparatus that have needs for a bipolar transistor with a high level of second channel linearity without sacrificing RF gain.

Systems implementing one or more aspects of the present disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, any portable device having a power amplifier, a mobile phone (for example, a smart phone), a telephone, a base station, a femtocell, a radar, a device configured to communication according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module including an RF transmission line, a power amplifier module, an integrated circuit including an RF transmission line, a substrate including an RF transmission line, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled," "connected," and the like, as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, For example, while processes or blocks are presented in a given order, alternative embodiments may perform routines having acts, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

While certain embodiments of the inventions have been described, these embodiments have been presented by way of example only, and are not intended to limit the scope of the disclosure. For example, various equivalent modifications are possible within the scope of the invention, as those skilled in the relevant art will recognize. Moreover, the elements and acts of the various embodiments described above can be combined to provide further embodiments. Indeed, the methods, systems, apparatus, and articles of manufacture described herein may be embodied in a variety of other forms; furthermore, various omissions, substitutions and changes in the form of the methods, systems, apparatus, and articles of manufacture described herein may be made without departing from the spirit of the disclosure. The accompanying claims and their equivalents are intended to cover such forms or modifications as would fall within the scope and spirit of the disclosure.

What is claimed is:

1. A bipolar transistor comprising a collector, a base disposed over the collector, and an emitter, the collector having a substantially flat doping concentration of at least $5 \times 10^{16}$ cm$^{-3}$ in a first collector region abutting the base such that an amplifier that includes the bipolar transistor has an alternative channel power ratio (ACPR2) of no greater than about −65 dBc, the collector also having an other collector region under the first collector region, the other collector region including at least one continuous grading having a minimum doping concentration of about one order of magnitude less than the doping concentrating of the first collector region, and the doping concentration of the at least one continuous grading increasing away from the first collector region.

2. The bipolar transistor of claim 1 wherein the other collector region includes a first grading and a second grading in which doping concentration increases away from the base at a different rate than in the first grading.

3. The bipolar transistor of claim 2 wherein the bipolar transistor has an output power of at least about 29 dBm at a frequency within a frequency band centered around about 833 MHz.

4. The bipolar transistor of claim 2 wherein the second grading is configured to increase $Bv_{CEX}$ of the bipolar transistor compared to the same transistor without the second grading at the same current density.

5. The bipolar transistor of claim 2 wherein a doping concentration in the first grading grades from the minimum doping concentration of the at least one continuous grading to less than the doping concentration of the first collector region.

6. The bipolar transistor of claim 5 wherein a doping concentration in the second grading grades from about a maximum doping concentration in the first grading to a doping concentration that is at least about one order of magnitude less than the doping concentration of a sub-collector below the second grading.

7. The bipolar transistor of claim 2 wherein the other collector region includes a second collector region proximate the first collector region and having a thickness that is more than approximately twice the thickness of the first collector region, the first grading spanning the second collector region.

8. The bipolar transistor of claim 7 wherein the other collector region further includes a third collector region having a thickness that is greater than the thickness of the first collector region and less than the thickness of the second collector region, the second grading spanning the third collector region.

9. The bipolar transistor of claim 8 wherein the collector consists essentially of the first collector region, the second collector region, and the third collector region, and the bipolar transistor further includes a sub-collector under the collector.

10. The bipolar transistor of claim 2 wherein the doping concentration in the second grading varies substantially linearly.

11. The bipolar transistor of claim 2 wherein the first grading borders the second grading and doping concentration is approximately the same on both sides of the border of the first grading and the second grading.

12. The bipolar transistor of claim 1 wherein a thickness of the first collector region is selected from a range of about 1000 Å to 2000 Å.

13. The bipolar transistor of claim 12 wherein the doping concentration of the first collector region is selected from a range of $5 \times 10^{16}$ cm$^{-3}$ to $9 \times 10^{16}$ cm$^{-3}$.

14. The bipolar transistor of claim 1 wherein the doping concentration in the first collector region is at least about $6 \times 10^{16}$ cm$^{-3}$.

15. The bipolar transistor of claim 1 wherein the base has a thickness of less than about 1400 Å.

16. The bipolar transistor of claim 15 wherein the base has a doping concentration selected from a range of about $3.5 \times 10^{19}$ cm$^{-3}$ to $7 \times 10^{19}$ cm$^{-3}$.

17. The bipolar transistor of claim 1 wherein the bipolar transistor is at least one of a heterojunction bipolar transistor (HBT) or a GaAs transistor.

18. The bipolar transistor of claim 1 wherein the ACPR2 is no greater than about −67 dBc.

19. The bipolar transistor of claim 1 further comprising a sub-collector under the collector, the doping concentration of the at least one continuous grading having a maximum doping concentration that is no more than about two orders of magnitude lower than a doping concentration of the sub-collector.

20. The bipolar transistor of claim 2 further comprising a sub-collector under the collector, the first grading having a doping concentration that increases from about $7.5 \times 10^{15}$ cm$^{-3}$ at an interface with the first collector region to about $3 \times 10^{16}$ cm$^{-3}$ and the second grading having a doping concentration that increases from about $3 \times 10^{16}$ cm$^{-3}$ where the first grading meets the second grading to about $6 \times 10^{16}$ cm$^{-3}$ at an interface with the sub-collector.

21. A power amplifier module comprising a bipolar transistor having a collector, a base, and an emitter, the collector having a doping concentration of at least $5 \times 10^{16}$ cm$^{-3}$ at a junction with the base such that the power amplifier has an alternative channel power ratio (ACPR2) of no greater than about −65 dBc, the collector also having at least a first grading having a minimum doping concentration of about one order of magnitude less than the doping concentration at the junction with the base, the first grading being a continuous grading and having a doping concentration that increases away from the base.

22. The power amplifier module of claim 21 wherein the ACPR2 is no greater than about −65 dBc when the power amplifier operates within a frequency band centered around approximately 833 MHz.

23. The power amplifier module of claim 21 wherein the collector further includes a second grading farther from the base than the first grading and bordering the first grading, the second grading having a doping concentration that increases away from the base at a different rate than in the first grading, the doping concentration of the second grading increasing away from the base and starting at a maximum doping concentration of the first grading, the maximum doping concentration of the first grading being less than the doping concentration at the junction with the base.

24. The power amplifier module of claim 23 wherein the second grading is configured to increase $Bv_{CEX}$ of the bipolar transistor compared to the same transistor without the second grading at the same current density.

25. The power amplifier module of claim 21 wherein the base has a doping concentration selected from a range of about $2 \times 10^{19}$ cm$^{-3}$ to $7 \times 10^{19}$ cm$^{-3}$.

26. The power amplifier module of claim 21 wherein the collector includes a first region abutting the base having a substantially flat doping concentration of at least $5 \times 10^{16}$ cm$^{-3}$ and a thickness selected from a range of about 1000 Å to 2000 Å.

27. The power amplifier module of claim 26 wherein the doping concentration in the first region of the collector is selected in the range from $5 \times 10^{16}$ cm$^{-3}$ to $9 \times 10^{16}$ cm$^{-3}$.

28. The power amplifier module of claim 21 wherein the power amplifier has the alternative channel power ratio (ACPR2) of no greater than about −65 dBc at an output power of at least 29 dBm.

29. A power amplifier die comprising a power amplifier including a bipolar transistor having a collector, a base abutting the collector, and an emitter, the collector having a doping concentration of at least $5 \times 10^{16}$ cm$^{-3}$ at a junction with the base such that the power amplifier has an alternative channel power ratio (ACPR2) of no greater than about −65 dBc, the collector also having at least a first grading in which doping concentration grades from a minimum doping concentration of about one order of magnitude less than the doping concentration at the junction with the base and increases away from the base to a maximum doping concentration of no more than the doping concentration of the collector at the junction with the base.

30. A mobile device comprising an antenna, a battery, and a power amplifier including a heterojunction bipolar transistor having a collector, a base, and an emitter, the collector including a first collector region abutting the base and having a substantially flat first doping concentration of at least about $3 \times 10^{16}$ cm$^{-3}$, a second collector region proximate the first collector region and having a first grading in which doping concentration increases away from the base from about one order of magnitude less than the substantially flat first doping concentration to less than the substantially flat first doping concentration, and a third collector region proximate the second collector region and having a second grading in which doping concentration increases away from the base at a different rate than the first grading, the first grading and the second grading configured to cause a radio frequency gain of the power amplifier to be improved.

31. A method of forming a bipolar transistor, the method comprising:
   forming a sub-collector;
   forming a collector region with at least one continuous grading having a doping concentration that decreases away from the sub-collector; and
   forming a different collector region adjacent the collector region with at least one continuous grading, the different collector region abutting a base of the bipolar transistor and having a doping concentration of at least $5 \times 10^{16}$ cm$^{-3}$ at an interface with the base such that an amplifier that includes the bipolar transistor has an alternative channel power ratio (ACPR2) of no greater than about −65 dBc, the at least one continuous grading having a doping concentration that grades from about one order of magnitude less than the doping concentration at the interface with the base to no more than about two orders of magnitude less than a doping concentration of the sub-collector.

* * * * *